(12) United States Patent
Filippi et al.

(10) Patent No.: US 11,378,601 B2
(45) Date of Patent: Jul. 5, 2022

(54) OPERATIONAL STATE DETERMINATION APPARATUS

(75) Inventors: Alessio Filippi, Eindhoven (NL); Ronald Rietman, Eindhoven (NL); Ying Wang, Eindhoven (NL); Ashish Vijay Pandharipande, Eindhoven (NL); Paul Anthony Shrubsole, Arnhem (NL)

(73) Assignee: SIGNIFY HOLDING B.V., Eindhoven (NL)

(*) Notice: Subject to any disclaimer, the term of this patent is extended or adjusted under 35 U.S.C. 154(b) by 260 days.

(21) Appl. No.: 13/877,514

(22) PCT Filed: Oct. 7, 2011

(86) PCT No.: PCT/IB2011/054428
§ 371 (c)(1),
(2), (4) Date: Apr. 3, 2013

(87) PCT Pub. No.: WO2012/049601
PCT Pub. Date: Apr. 19, 2012

(65) Prior Publication Data
US 2013/0211756 A1     Aug. 15, 2013

(30) Foreign Application Priority Data
Oct. 14, 2010   (EP) .................................. 10187560

(51) Int. Cl.
*G01R 19/25*     (2006.01)
*G01D 4/00*      (2006.01)
(Continued)

(52) U.S. Cl.
CPC ......... *G01R 19/2513* (2013.01); *G01D 4/002* (2013.01); *G01R 21/133* (2013.01);
(Continued)

(58) Field of Classification Search
USPC ..................................................... 702/57–65
See application file for complete search history.

(56) References Cited

U.S. PATENT DOCUMENTS

| 4,848,141 A | 7/1989 | Oliver |
| 4,858,141 A | 8/1989 | Hart |

(Continued)

FOREIGN PATENT DOCUMENTS

| EP | 0554424 B1 | 8/1993 | |
| GB | 2465367 A * | 5/2010 | ........... G01R 21/133 |
| WO | 2009076697 A1 | 6/2009 | |

OTHER PUBLICATIONS

*Electric Power Group* v. *Alstom* (Case Attached).*
(Continued)

*Primary Examiner* — Kyle R Quigley
*Assistant Examiner* — Leonard S Liang
(74) *Attorney, Agent, or Firm* — Daniel J. Piotrowski (57) ABSTRACT

The invention relates to an operational state determination apparatus (1) for determining whether a variation in a determined electrical parameter of an electrical network (2) is caused by a variation in an operational state of an electrical consumer of the electrical network. The electrical network comprises multiple electrical consumers (3, 4, 5) and a voltage source (6), wherein a variation classification unit (10) determines whether a variation in the determined electrical parameter of the electrical network is caused by a variation in the operational state of an electrical consumer of the network depending on a decision variable which depends on a variation in a measured voltage and a variation in a measured current of the electrical network. This determination can be performed, without directly using the variation in the determined electrical parameter of the electrical
(Continued)

network and is therefore less influenced by random voltage fluctuations in the electrical network.

12 Claims, 8 Drawing Sheets

(51) Int. Cl.
*G01R 21/133* (2006.01)
*G01R 35/00* (2006.01)
G06Q 50/06 (2012.01)
H02J 3/12 (2006.01)
H02J 3/00 (2006.01)
H02J 3/14 (2006.01)
H02J 3/16 (2006.01)

(52) U.S. Cl.
CPC ............. *G01R 35/00* (2013.01); *G06Q 50/06* (2013.01); *H02J 3/00* (2013.01); *H02J 3/12* (2013.01); *H02J 3/14* (2013.01); *H02J 3/16* (2013.01); *Y02B 90/20* (2013.01); *Y04S 20/30* (2013.01)

(56) References Cited

U.S. PATENT DOCUMENTS

| | | | | |
|---|---|---|---|---|
| 4,910,455 A * | 3/1990 | Nadd | G01R 19/32 324/103 P |
| 5,365,453 A * | 11/1994 | Startup | G01R 31/3648 320/136 |
| 5,483,153 A * | 1/1996 | Leeb | G01R 19/25 324/102 |
| 5,717,325 A * | 2/1998 | Leeb | G01R 21/1331 324/76.12 |
| 5,719,526 A * | 2/1998 | Fink | H03F 1/34 324/713 |
| 5,737,730 A * | 4/1998 | Alvarenga | G06Q 50/06 324/140 D |
| 5,963,457 A * | 10/1999 | Kanoi | H02J 3/00 340/870.03 |
| 6,081,123 A * | 6/2000 | Kasbarian | H02J 13/0048 324/521 |
| 6,211,681 B1 * | 4/2001 | Kagawa | B60K 6/46 320/104 |
| 6,603,218 B1 * | 8/2003 | Aisa | H02J 3/14 307/31 |
| 7,526,366 B2 * | 4/2009 | Rehtanz | H02J 3/06 363/78 |
| 7,693,670 B2 * | 4/2010 | Durling | G01D 4/008 700/291 |
| 7,698,233 B1 * | 4/2010 | Edwards | G06Q 10/06 705/412 |
| 8,275,561 B2 * | 9/2012 | Alles | H02J 3/00 702/61 |
| 8,344,724 B2 * | 1/2013 | Leeb | G01R 33/12 324/228 |
| 8,447,541 B2 * | 5/2013 | Rada | G05F 1/70 702/60 |
| 8,577,661 B2 * | 11/2013 | Nasle | G05B 17/02 700/286 |
| 8,812,427 B2 * | 8/2014 | Kim | G06F 11/3062 706/52 |
| 2003/0053275 A1 * | 3/2003 | Rehtanz | H02J 3/06 361/115 |
| 2006/0119368 A1 * | 6/2006 | Sela | G01R 19/2513 324/522 |
| 2008/0208496 A1 * | 8/2008 | Habath | G01R 19/2513 702/77 |
| 2009/0195349 A1 * | 8/2009 | Frader-Thompson | G01D 4/002 340/3.1 |
| 2009/0225479 A1 * | 9/2009 | Jayanth | G01R 19/10 361/30 |
| 2009/0281742 A1 * | 11/2009 | Carter | G01D 4/002 702/60 |
| 2009/0307178 A1 * | 12/2009 | Kuhns | G06Q 10/06 706/54 |
| 2009/0319207 A1 * | 12/2009 | Koch | H02H 1/0038 702/58 |
| 2010/0110077 A1 * | 5/2010 | Grossman | G06Q 10/06 345/440 |
| 2010/0185338 A1 * | 7/2010 | Montgomery | H02J 3/14 700/292 |
| 2010/0301883 A1 * | 12/2010 | Meyers | G01R 31/026 324/705 |
| 2010/0305889 A1 * | 12/2010 | Tomlinson, Jr. | G06N 7/005 702/62 |
| 2011/0109306 A1 * | 5/2011 | Leeb | G01R 33/12 324/228 |
| 2011/0144819 A1 * | 6/2011 | Andrews | G01D 4/004 700/291 |
| 2011/0153246 A1 * | 6/2011 | Donaldson | G01R 21/1331 702/65 |
| 2011/0191041 A1 | 8/2011 | Diop | |
| 2011/0213739 A1 * | 9/2011 | Benitez | G06Q 10/04 706/14 |
| 2011/0251807 A1 * | 10/2011 | Rada | G01D 4/00 702/61 |
| 2011/0285362 A1 * | 11/2011 | Huomo | H02J 3/1892 323/205 |
| 2011/0301894 A1 * | 12/2011 | Sanderford, Jr. | G01D 4/004 702/65 |
| 2012/0001617 A1 * | 1/2012 | Reynolds | G01R 15/20 324/74 |
| 2012/0004871 A1 * | 1/2012 | Tsao | G01R 19/2513 702/61 |
| 2012/0062249 A1 * | 3/2012 | Shamir | G01R 15/186 324/679 |
| 2012/0083930 A1 * | 4/2012 | Ilic | G06Q 30/06 700/287 |
| 2012/0136593 A1 * | 5/2012 | Donaldson | G01D 4/002 702/60 |
| 2012/0290230 A1 * | 11/2012 | Berges Gonzalez | G01D 4/004 702/61 |
| 2013/0046414 A1 * | 2/2013 | Ree | H02J 3/1892 700/297 |
| 2013/0076339 A1 * | 3/2013 | Veronesi | G01D 4/002 324/103 R |
| 2013/0178998 A1 * | 7/2013 | Gadiraju | G06Q 50/06 700/296 |
| 2013/0187665 A1 * | 7/2013 | Rietman | G01R 19/2513 324/603 |
| 2013/0191051 A1 * | 7/2013 | Stocker | G01D 4/004 702/59 |
| 2013/0338948 A1 * | 12/2013 | Zeifman | G01D 4/002 702/60 |

OTHER PUBLICATIONS

Chang, Hsueh-Hsien et al "Applying a Non-Instrusive Energy-Management System to Economic Dispatch for a Cogeneration System and Power Utility" Applied Energy, vol. 86, 2009, pp. 2335-2343.

Chang, Hsueh-Hsien et al "Load Recognition for Different Loads with the Same Real Power and Reactive Power in a Non-lnstrusive Load-Monitoring System", Computer Supported Cooperative Work in Design, 2008, IEEE Int'l Conf. pp. 1122-1127.

Chang, Hsueh-Hsien et al "Load Identification in Nonintrusive Load Monitoring Using Steady-State and Turn-on Transient Energy Algorithms" Proceedings of the 2010 14th Int'l Conf. on Computer Supported Cooperative Work in Design, pp. 27-32.

Du, Yi et al "A Review of Identification and Monitoring Methods for Electric Loads in Commercial and Residential Buildings", Energy Conversion Congress and Exposition (ECCE), 2010 IEEE, pp. 4527-4533.

Flores, Rafael "Signal Processing Tools for Power Quality Event Classification", Sweden 2003, Department of Signals and Systems.

(56) References Cited

OTHER PUBLICATIONS

Hart, George W. "Nonintrusive Appliance Load Monitoring", Proceedings of the IEEE, vol. 80, No. 12, Dec. 1992, pp. 1870-1891.

Pihala, Hannu, "Non-Intrusive Appliance Load Monitoring System based on a Modern kWh-Meter", VTT Publications, vol. 356, May 1998.

Sawyer, Rebecca L. et al "Creating Low-Cost Energy-Management Systems for Homes using Non-Intrusive Energy Monitoring Devices" Energy Conversion Congress and Exposition, Sep. 2009. pp. 3239-3246.

Shaw, Steven R. et al., "Nonintrusive Load Monitoring and Diagnostics in Power Systems", IEEE Transactions on Instrumentation and Measurement, vol. 57, No. 7, Jul. 2008, pp. 1445-1454.

Styvaktakis, Emmanouil et al "Automatic Classification of Power System Events using rms Voltage Measurements", IEEE, 202, pp. 824-829.

Wichakool, Warit et al "Modeling and Estimating Current Harmnonics of Variable Electronic Loads", IEEE Transactions on Power Electronics, vol. 24, No. 12, Dec. 2009, pp. 2803-2811.

Yang, Hong-Tzer et al "Design a Neural Network for Features Selection in Non-Intrusive Monitoring of Industrial Electrical Loads", Proceedings of the 2007 11th Int'l Conf. on Computer Supported Cooperative Work in Design, pp. 1022-1027.

Zaidi, Adeel Abbas et al "Automated Demand Side Management in Microgrids using Load Recognition", Industrial Informatics (INDIN), 2010 8th IEEE Int'l Conf, pp. 774-779.

\* cited by examiner

OPERATIONAL STATE DETERMINATION APPARATUS

FIELD OF THE INVENTION

The invention relates to an operational state determination apparatus, an operational state determination method and an operational state determination computer program for determining whether a variation in a determined electrical parameter of an electrical network is caused by a variation in an operational state of an electrical consumer of the electrical network. The invention relates further to a disaggregation apparatus, a disaggregation method and a disaggregation computer program for identifying an electrical consumer, of which an operational state has been changed, in an electrical network.

BACKGROUND OF THE INVENTION

The article "Non-intrusive appliance load monitoring system based on a modern kWh-meter" by H. Pihala, VTT publications, Espoo, 1998 discloses a disaggregation apparatus for determining a change in an operational state of an electrical consumer of an electrical network. The disaggregation apparatus allows detecting the change in the operational state of the electrical consumer and determining of which electrical consumer the operational state has been changed by monitoring the normalized complex power of the electrical network. However, the detection of a change in the operational state can be disturbed by random voltage fluctuations in the electrical network. For example, a significant voltage drop will strongly influence the reading of the complex power and, thus, adversely influence the detection of a change in the operational state on an electrical consumer of the electrical network.

SUMMARY OF THE INVENTION

It is an object of the present invention to provide an operational state determination apparatus, an operational state determination method and an operational state determination computer program for determining whether a variation in a determined electrical parameter of an electrical network is caused by a variation in an operational state of an electrical consumer of the electrical network and not by, for example, random voltage fluctuations in the electrical network, wherein the reliability of this determination can be improved. It is a further object of the present invention to provide a corresponding disaggregation apparatus, a disaggregation method and a disaggregation computer program for identifying an electrical consumer, of which an operational state has been changed, in an electrical network.

In a first aspect of the present invention an operational state determination apparatus for determining whether a variation in a determined electrical parameter of an electrical network is caused by a variation in an operational state of an electrical consumer of the electrical network is presented, wherein the electrical network comprises multiple electrical consumers and a voltage source, wherein the operational state determination apparatus comprises:
  a voltage meter for measuring a voltage in the electrical network,
  a current meter for measuring a current in the electrical network,
  a decision variable determination unit for determining a decision variable depending on a variation in the measured voltage and a variation in the measured current, wherein the decision variable is indicative of whether a variation in the determined electrical parameter of the electrical network is caused by a variation in the operational state of an electrical consumer,
  a variation classification unit for determining whether a variation in the determined electrical parameter of the electrical network is caused by a variation in the operational state of an electrical consumer of the network depending on the determined decision variable.

Since the decision variable, which depends on a variation in the measured voltage and a variation in the measured current, is used for determining whether the variation in the determined electrical parameter of the electrical network is caused by a variation in the operational state of an electrical consumer of the network, this determination can be performed, without directly using the variation in the determined electrical parameter of the electrical network. The influence of random voltage fluctuations in the electrical network, which generally affect the variation in the determined electrical parameter, on the determination whether the variation in the determined electrical parameter of the electrical network is caused by a variation in the operational state of an electrical consumer of the electrical network or not can therefore be reduced, thereby improving the reliability of this determination.

The operational state determination apparatus is preferentially adapted to measure the voltage and the current in the electrical network at a single location in the electrical network.

The operational state of an electrical consumer is changed, if, for example, the electrical consumer is switched on or switched off.

It is preferred that the decision variable determination unit is adapted to determine the decision variable depending on a ratio of a variation in the voltage and a variation in the current. It is further preferred that the variation classification unit is adapted to determine that a variation in the determined electrical parameter of the electrical network is caused by a variation in the operational state of an electrical consumer by comparing the ratio with a predefined threshold. In an embodiment, the threshold can be zero. It is preferred that the threshold is predefined such that a ratio, which is smaller than the threshold, indicates that the change in the determined electrical parameter of the electrical network is caused by a variation in the operational state of an electrical consumer, wherein the variation classification unit is adapted to determine that a variation in the determined electrical parameter of the electrical network is caused by a variation in the operational state of an electrical consumer, if the ratio is smaller than the threshold. The determination whether the variation in the determined electrical parameter of the electrical network is caused by a variation in the operational state of an electrical consumer based on the ratio and the threshold allows performing this determination in a very simple way by just calculating a ratio of two measured parameters and by comparing this ratio with a threshold.

It is further preferred that the variation classification unit is adapted to determine that a variation in the determined electrical parameter of the electrical network is caused by a variation in the operational state of an electrical consumer of the network depending on the determined decision variable and depending on the magnitude of the variation in the determined electrical parameter. In particular, the variation classification unit is adapted to determine that a variation in the determined electrical parameter of the electrical network is caused by a variation in the operational state of an electrical consumer of the network depending on the determined decision variable and depending on whether the magnitude of the variation in the determined electrical parameter is larger than a predefined threshold. The predefined threshold can be determined by calibration measurements, wherein it is known whether an operational state of an electrical consumer of the network has been varied or not, while the variation in the determined electrical parameter is monitored. Since not only the decision variable but also the magnitude of the variation in the determined electrical parameter can be used for determining whether a variation in the determined electrical parameter of the electrical network is caused by a variation in the operational state of an electrical consumer of the network, the reliability of this determination can further be improved.

It is preferred that the operational state determination apparatus comprises an electrical parameter determination unit for determining the electrical parameter depending on at least one of the measured voltage and the measured current. The electrical parameter can also be the measured current or the measured voltage. Preferentially, the electrical parameter determination unit is adapted to determine a power consumed by the electrical network as the electrical parameter. In particular, the electrical parameter determination unit is adapted to determine the normalized complex power consumed by the electrical network as the electrical parameter.

It is further preferred that the operational state determination apparatus comprises a variation determination unit for determining whether a variation in the determined electrical parameter is present. For example, the variation determination unit can be adapted to determine that a variation in the determined electrical parameter is present, if the magnitude of the variation is larger than a predefined threshold, wherein the decision variable determination unit and the variation classification unit are adapted such that they perform their determination procedures, after the variation determination unit has been determined, that a variation in the determined electrical parameter is present.

In another aspect of the present invention a disaggregation apparatus for identifying an electrical consumer, of which an operational state has been changed, in an electrical network is presented, wherein the electrical network comprises multiple electrical consumers and a voltage source and wherein the disaggregation apparatus comprises:
an operational state determination apparatus for determining whether a variation in a determined electrical parameter of an electrical network is caused by a variation in an operational state of an electrical consumer of the electrical network as defined in claim 1,
an electrical parameter determination unit for determining the electrical parameter depending on at least one of the measured voltage and the measured current,
an electrical consumer determination unit for determining an electrical consumer, of which the operational state has been varied, depending on the variation in the determined electrical parameter, if the variation classification unit has determined that the variation in the determined electrical parameter is caused by a variation in the operational state of an electrical consumer of the network. Since the electrical consumer determination unit determines an electrical consumer, of which the operational state has been varied, depending on the variation in the determined electrical parameter, if the variation classification unit has determined that the variation in the determined electrical parameter is caused by a variation in the operational state of electrical consumer of the network, the determination of the electrical consumer, of which the operational state has been varied, really depends on a variation in the determined electrical parameters, which is caused by the respective electrical consumer, and not, for example, by random voltage fluctuations in the electrical network. The identification of an electrical consumer within the electrical network can therefore be improved.

Preferentially, the electrical consumer determination unit comprises a memory, in which characteristics of the variation of the determined electrical parameter, which is indicative of the respective electrical consumer of the electrical network, are stored. By comparing the determined variation in the electrical parameter with the stored characteristics the electrical consumer, of which the operational state has been changed, can be determined.

It is further preferred that the disaggregation apparatus comprises an energy consumption determination unit for determining the energy consumption of the determined electrical consumer.

In a further aspect of the present invention an operational state determination method for determining whether a variation in a determined electrical parameter of an electrical network is caused by a variation in an operational state of an electrical consumer of the electrical network is presented, wherein the electrical network comprises multiple electrical consumers and a voltage source, wherein the operational state determination method comprises:
measuring a voltage in the electrical network,
measuring a current in the electrical network,
determining a decision variable depending on a variation in the measured voltage and a variation in the measured current, wherein the decision variable is indicative of whether a variation in the determined electrical parameter of the electrical network is caused by a variation in the operational state of an electrical consumer,
determining whether a variation in the determined electrical parameter of the electrical network is caused by a variation in the operational state of an electrical consumer of the network depending on the determined decision variable.

In another aspect of the present invention a disaggregation method for identifying an electrical consumer, of which an operational state has been changed, in an electrical network is presented, wherein the electrical network comprises multiple electrical consumers and a voltage source and wherein the disaggregation method comprises:
a method for determining whether a variation in a determined electrical parameter of an electrical network is caused by a variation in an operational state of an electrical consumer of the electrical network as defined in claim 1,
determining the electrical parameter depending on at least one of the measured voltage and the measured current,
determining an electrical consumer, of which the operational state has been varied, depending on the variation in the determined electrical parameter, if the variation in the determined electrical parameter is caused by a variation in the operational state of an electrical consumer of the network.

In a further aspect of the present invention an operational state determination computer program for determining whether a variation in a determined electrical parameter of an electrical network is caused by a variation in an operational state of an electrical consumer of the electrical network is presented, wherein the operational state determination computer program comprises program code means for causing an operational state determination apparatus as defined in claim 1 to carry out the steps of the method as defined in claim 11, when the operational state determination computer program is run on a computer controlling the operational state determination apparatus.

In another aspect of the present invention a disaggregation computer program for identifying an electrical consumer, of which an operational state has been changed, in an electrical network is presented, wherein the electrical network comprises multiple electrical consumers and a voltage source, the disaggregation computer program comprising program code means for causing a disaggregation apparatus as defined in claim 9 to carry out the steps of the disaggregation method as defined in claim 12, when the disaggregation computer program is run on a computer controlling the disaggregation apparatus.

It shall be understood that the operational state determination apparatus of claim 1, the disaggregation apparatus of claim 9, the operational state determination method of claim 11, the disaggregation method of claim 12, the operational state determination computer program of claim 13 and the disaggregation computer program of claim 14 have similar and/or identical preferred embodiments as defined in the dependent claims.

It shall be understood that a preferred embodiment of the invention can also be any combination of the dependent claims with the respective independent claim.

These and other aspects of the invention will be apparent from and elucidated with reference to the embodiments described hereinafter.

DETAILED DESCRIPTION OF EMBODIMENTS

Figure 1:
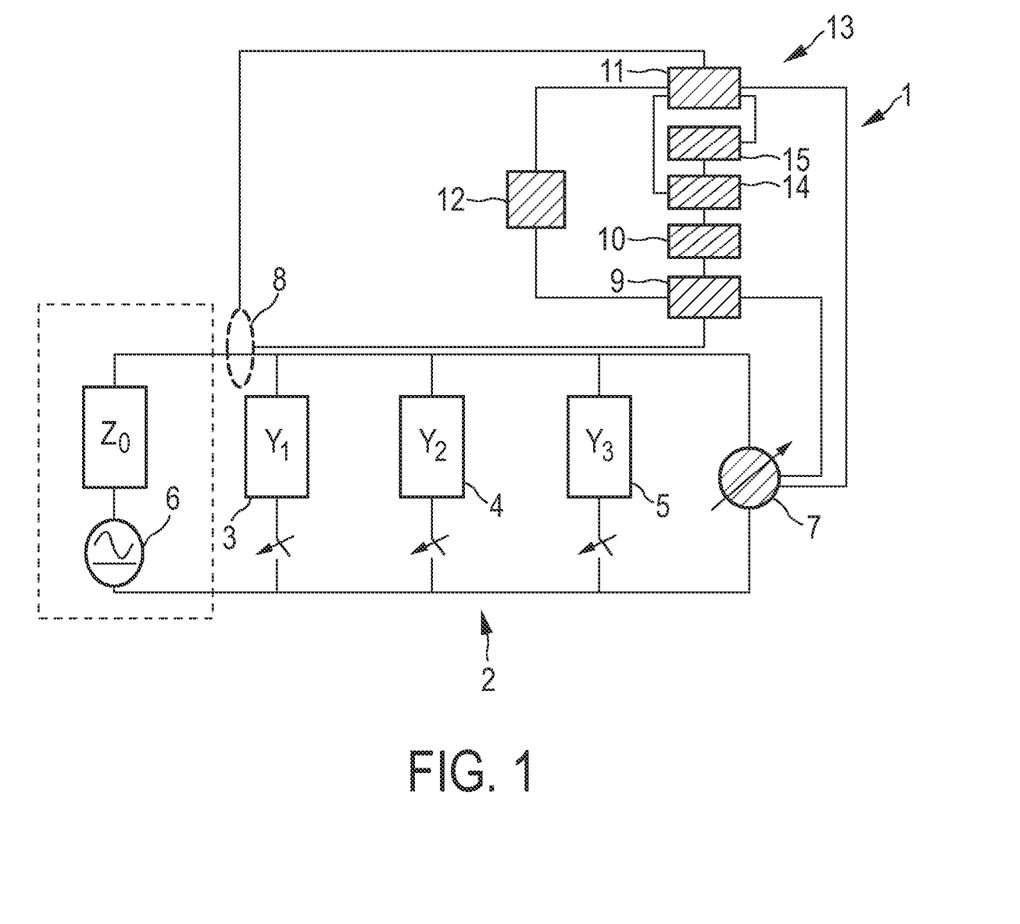
FIG. 1 shows schematically and exemplarily an embodiment of a disaggregation apparatus, which includes an operational state determination apparatus and which is connected to an electrical network comprising several electrical consumers.

FIG. 1 shows schematically and exemplarily a disaggregation apparatus 13 for identifying an electrical consumer, of which an operational state has been changed, in an electrical network 2. The electrical network 2 comprises multiple electrical consumers 3, 4, 5 and a power source 6. The disaggregation apparatus 13 comprises a voltage meter 7 for measuring a voltage in the electrical network and a current meter 8 for measuring a current in the electrical network at a single location in the electrical network, i.e. the disaggregation apparatus 13 does not measure the voltage and the current of each electrical consumer 3, 4, 5 at several locations at which the respective electrical consumer 3, 4, 5 is connected in the electrical network 2.

The electrical network schematically and exemplarily shown in FIG. 1 can be an electrical power network in a building, for example, in a home or in an office. In FIG. 1, the electrical network is modeled, wherein the model electrical network comprises an ideal voltage generator 6 and an effective internal impedance $Z_0$, which are modeled in accordance with Thevenin's theorem. The ideal voltage generator 6 and the effective internal impedance $Z_0$ can represent one or several voltage sources, one or several current sources and one or several loads. FIG. 1 is preferably an equivalent electrical scheme of a single phase house.

The disaggregation apparatus 13 includes an operational state determination apparatus 1 for determining whether a variation in a determined electrical parameter of the electrical network 2 is caused by a variation in an operational state of an electrical consumer of the electrical network 2. The operational state determination apparatus 1 comprises the voltage meter 7 and the current meter 8 and an electrical parameter determination unit 11 for determining the electrical parameter depending on at least one of the measured voltage and the measured current. In this embodiment, the electrical parameter determination unit 11 is adapted to the determine the power consumed by the electrical network 2 as the electrical parameter. In particular, the electrical parameter determination unit 11 is adapted to determine the normalized complex power consumed by the electrical network 2 as the electrical parameter.

The operational state determination apparatus 1 further comprises a variation determination unit 12 for determining whether a variation in the determined electrical parameter is present. In this embodiment, the variation determination unit 12 is adapted to determine whether a variation in the power determined by the electrical parameter determination unit 11 is present. If a variation is present in the determined electrical parameter, it has to be determined whether this variation in the electrical parameter is caused by a variation in an operational state of an electrical consumer of the electrical network 2 or by, for example, random voltage fluctuations in the electrical network 2. The operational state determination apparatus 1 therefore further comprises a decision variable determination unit 9 for determining a decision variable depending on the variation in the measured voltage and the variation in the measured current, wherein the decision variable is indicative of whether the variation in the determined electrical parameter, i.e. in this embodiment, the power, of the electrical network 2 is caused by a variation in the operational state of an electrical consumer. In this embodiment, the decision variable determination unit 9 is adapted to determine the decision variable depending on a ratio of a variation in the voltage and a variation in the current.

The operational state determination apparatus 1 further comprises a variation classification unit 10 for determining whether a variation in the determined electrical parameter of the electrical network 2 is caused by a variation in the operational state of an electrical consumer of the network depending on the determined decision variable. In this embodiment, the variation classification unit 10 is adapted to determine that a variation in the determined electrical parameter of the electrical network 2 is caused by a variation in the operational state of an electrical consumer by comparing the ratio with a predefined threshold which is predefined such that a ratio, which is smaller than the threshold, indicates that the change in the determined electrical parameter of the electrical network 2 is caused by a variation in the operational state of an electrical consumer, wherein the variation classification unit 10 is adapted to determine that a variation in the determined electrical parameter of the electrical network 2 is caused by a variation in the operational state of an electrical consumer, if the ratio is smaller than the threshold. The threshold may be zero. In particular, the variation classification unit 10 can be adapted to determine that a variation in the determined electrical parameter of the electrical network is caused by a variation in the operational state of an electrical consumer of the network, if the ratio is smaller than the threshold and if the magnitude of the variation in the determined electrical parameter, i.e. in this embodiment in the power, is larger than a further threshold. These thresholds can be determined by calibration measurements, wherein the electrical parameter, i.e. in this embodiment the power, is determined while it is known whether the operational state of the electrical consumer is modified or not.

The disaggregation apparatus 13 further comprises an electrical consumer determination unit 14 for determining an electrical consumer, of which the operational state has been varied, depending on the variation in the determined electrical parameter, if the variation classification unit 10 has determined that the variation in the determined electrical parameter, i.e. in this embodiment in the power, is caused by a variation in the operational state of an electrical consumer of the network 2. Each electrical consumer 3, 4, 5 has a characteristic complex power, which can be stored in a memory of the electrical consumer determination unit 14. The electrical consumer determination unit 14 is preferentially adapted to determine of which electrical consumer the operational state has been changed by comparing the power determined by the electrical parameter determination unit 11 with the stored characteristics of the power of the different electrical consumers 3, 4, 5. This will in the following be described with reference to FIG. 2 which shows exemplarily a time evolution of the total complex power which can be determined by the electrical parameter determination unit 11.

Figure 2:
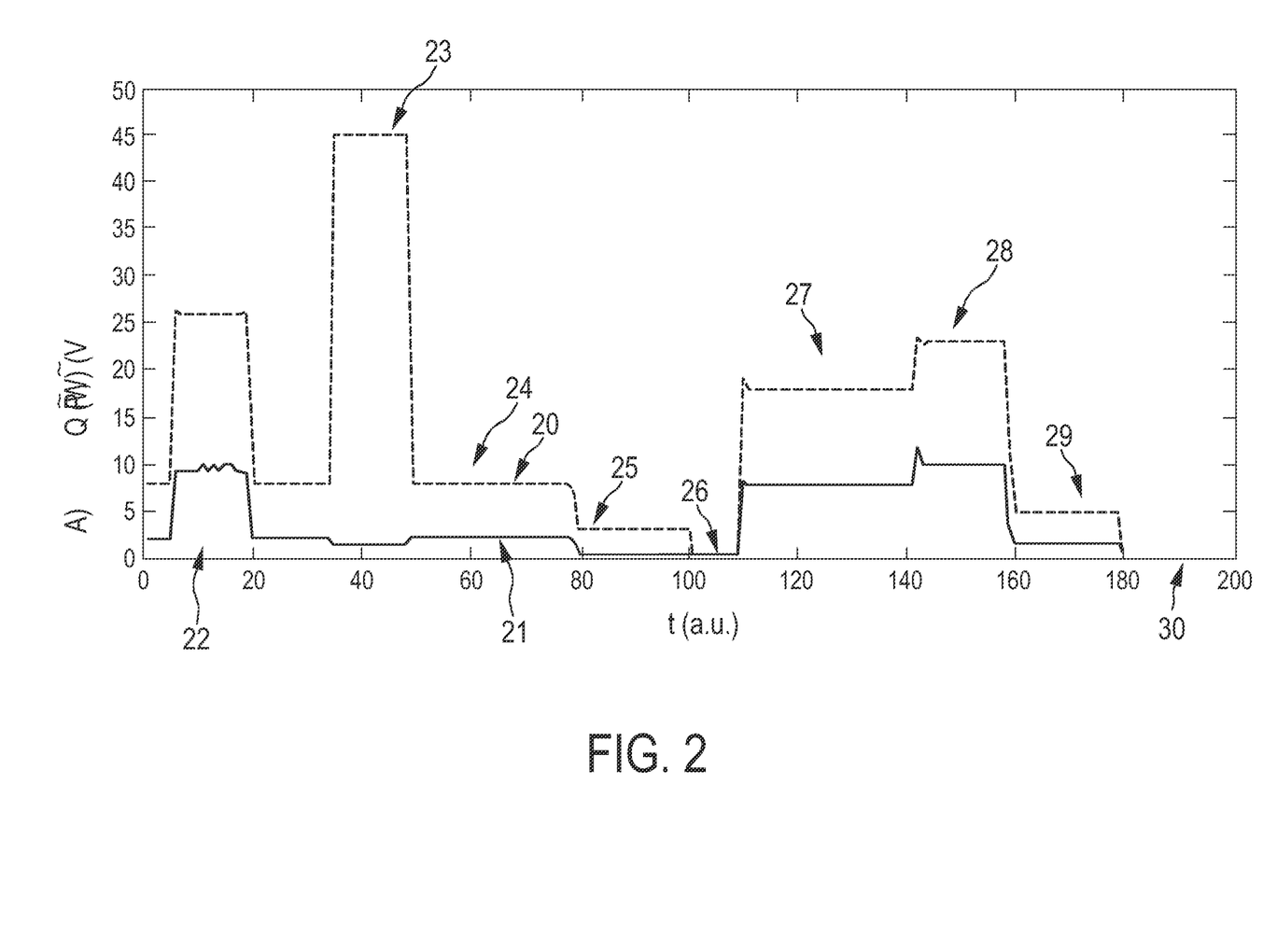
FIG. 2 shows exemplarily a time evolution of an overall power consumption of an electrical network.

FIG. 2 shows the real part $\tilde{P}$ of the normalized complex power, i.e. the active power, and the imaginary part $\tilde{Q}$ of the normalized complex power, i.e. the reactive power. In FIG. 2, the active power is indicated by the broken line 20 and the reactive power is indicated by the solid line 21. In this example, at about t=5 a compact fluorescent light (CFL) having a nominal power of 20 W is switched on and at t=20 switched off. This results in a change in the active power and the reactive power in region 22. At t=35 an incandescent lamp having a nominal power of 40 W is switched on and at t=45 the incandescent lamp is switched off. This results in a change in the active power and the reactive power in region 23. At about t=80 and at t=100, respectively, further electrical consumers are switched off. These further switching procedures result in further changes in the active power and the reactive power in regions 24, 25, 26. In region 26 all electrical consumers are switched off. At t=110 the CFL with the nominal power of 20 W is switched on again, which results in a change of the active power and the reactive power in region 27 which is similar to the change of the active power and the reactive power in region 22. At t=140 a further CFL having a nominal power of 5 W is switched on resulting in a further change in the active power and reactive power in region 28. At about t=160 the first CFL with the nominal power of 20 W is switched off and at about t=180 also the second CFL with the nominal power of 5 W is switched off. This results in further changes in the active power and the reactive power in regions 29 and 30.

In this embodiment, the changes or jumps, which are characteristic for the respective electrical consumer, are stored in the electrical consumer determination unit 14. By comparing the stored changes or jumps with the jumps or changes of the actually determined complex power, it can be determined which electrical consumer has been switched on and switched off and it can be determined at which time the respective electrical consumer has been switched on and switched off. For example, the electrical consumer determination unit 14 can be adapted to assign an electrical consumer to a jump or change by comparing the real part, the imaginary part or the entire complex power defined by the actual jump or change with the stored corresponding values. The electrical consumer determination unit can be adapted to determine the electrical consumer, for which the real part of the complex power, the imaginary part of the complex power and/or the entire complex power is closest to the actually measured real part of the complex power, imaginary part of the complex power and/or entire complex power of the actually measured change or jump. The electrical consumer determination unit can also be adapted to use more evolved techniques for comparing the actually measured jump or change in the complex power with stored corresponding values. For example, the electrical consumer determination unit can be adapted to compare the time evolution of the actually measured real part of the complex power, imaginary part of the complex power and/or entire complex power, with characteristics of the time evolution of the real part of the complex power, imaginary part of the complex power and/or entire complex power, respectively, which may be stored in the electrical consumer determination unit.

The disaggregation apparatus 13 further comprises an energy consumption determination unit 15 for determining the energy consumption of the determined electrical consumer. Preferentially, the energy consumption determination unit 15 receives from the electrical consumer determination unit 14 the times, at which the respective determined electrical consumer has been switched on and switched off, if the respective electrical consumer has already been switched off. Based on the switch on and switch off times or based on the switch on time and the actual time, if the respective electrical consumer has not already been switched off, the time of power consumption is determined by the energy consumption determination unit 15, and the energy consumption determination unit 15 determines the consumed energy by multiplying the amplitude of the change or jump in the real power with the determined time of power consumption.

The disaggregation apparatus 13 comprises the elements which are shaded in FIG. 1 and the current sensor 8, wherein the voltage meter 7, the current meter 8, the decision variable determination unit 9, the variation classification unit 10, the electrical parameter determination unit 11 and the variation determination unit 12 are comprised by the operational state determination apparatus 1 which is included by the disaggregation apparatus 13. In the following an embodiment of an operational state determination method for determining whether a variation in a determined electrical parameter of an electrical network is caused by a variation in an operational state of an electrical consumer of the electrical network 2 will be exemplarily described with reference to a flowchart shown in FIG. 3.

Figure 3:
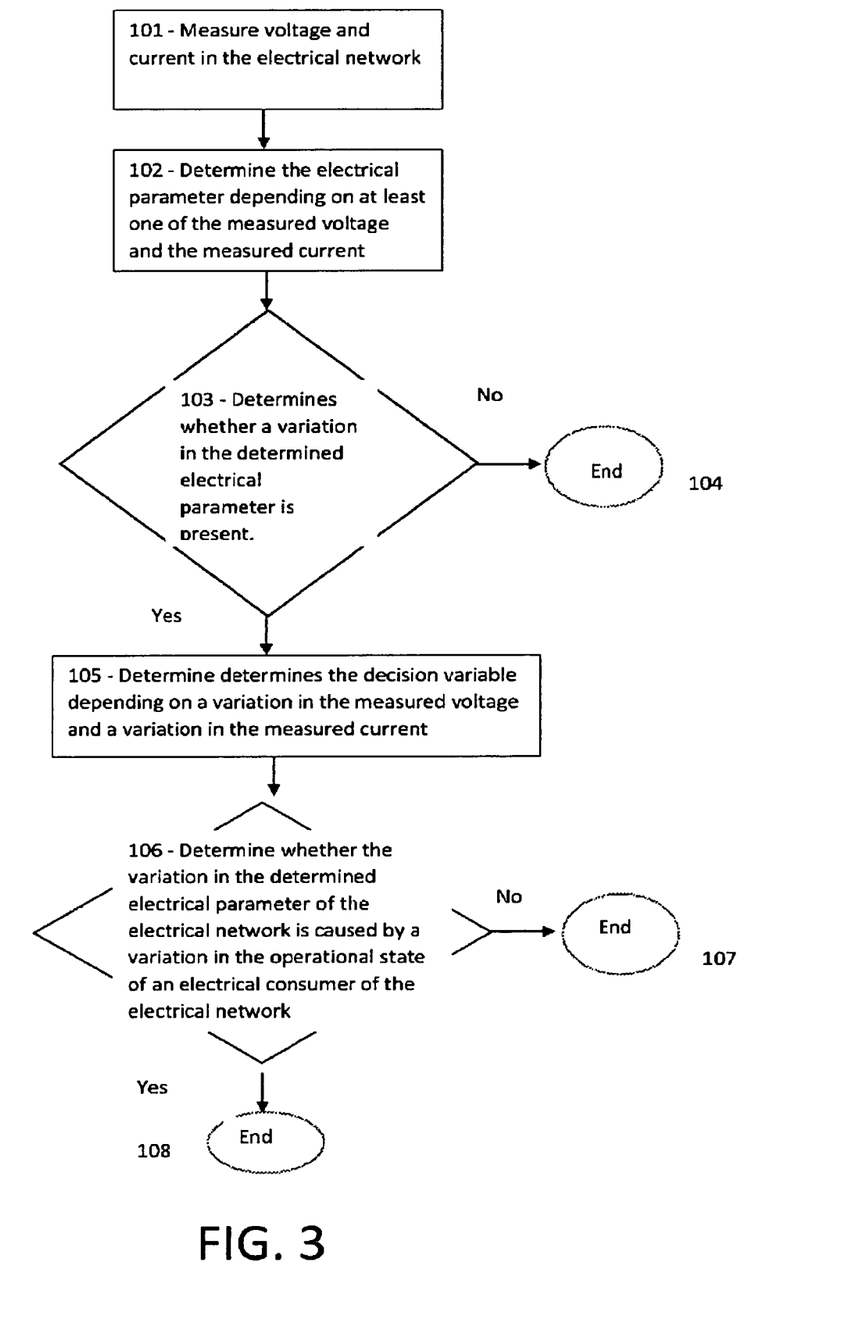
FIG. 3 shows a flowchart exemplarily illustrating an embodiment of an operational state determination method.

In step 101, a voltage and a current are measured in the electrical network 2 by the voltage meter 7 and the current meter 8. In step 102, the electrical parameter determination unit 11 determines the electrical parameter depending on at least one of the measured voltage and the measured current. In this embodiment, the electrical parameter determination unit 11 determines the normalized complex power consumed by the electrical network 2 as the electrical parameter. In step 103, the variation determination unit 12 determines whether a variation in the determined electrical parameter, i.e. in this embodiment in the normalized complex power, is present. If the variation determination unit 12 determines that a variation in the determined electrical parameter is not present, the operational state determination method ends with respect to the actually measured voltage and current in step 104. If the variation determination unit 12 has determined that a variation in the determined electrical parameter, i.e. in this embodiment in the normalized complex power, is present, the operational state determination method continues with step 105.

In step 105, the decision variable determination unit 9 determines the decision variable depending on a variation in the measured voltage and a variation in the measured current, wherein the decision variable is indicative of whether the variation in the determined electrical parameter of the electrical network 2 is caused by a variation in the operational state of an electrical consumer. In this embodiment, the decision variable determination unit 9 determines the decision variable depending on a ratio of a variation in the voltage and a variation in the current. In step 106, the variation classification unit 10 determines whether the variation in the determined electrical parameter of the electrical network is caused by a variation in the operational state of an electrical consumer of the electrical network 2 depending on the determined decision variable. In this embodiment, the variation classification unit 10 determines that the variation in the determined electrical parameter of the electrical network 2 is caused by a variation in the operational state of an electrical consumer by comparing the ratio with a predefined threshold which may be zero. The threshold is predefined such that a ratio, which is smaller than the threshold, indicates that the change in the determined electrical parameter of the electrical network 2 is caused by a variation in the operational state of an electrical consumer. The variation classification unit 10 determines therefore that the variation in the determined electrical parameter of the electrical network 2 is caused by a variation in the operational state of an electrical consumer, if the ratio is smaller than the threshold. If it is determined that the variation in the determined electrical parameter, i.e. in this embodiment in the normalized complex power, is caused by a variation in the operational state of an electrical consumer, the operational state determination method ends with respect to the currently measured voltage and current in step 108. If the ratio is larger than the predefined threshold, the variation classification unit 10 determines that the variation in the determined electrical parameter, i.e. in this embodiment in the normalized complex power, is not caused by a variation in the operational state of an electrical consumer and the operational state determination method ends with respect to the currently measured voltage and current in step 107.

The current and the voltage are preferentially repeatedly measured, the normalized complex power is preferentially repeatedly determined, and steps 103 to 108 are preferentially performed for each determined normalized complex power value, in order to continuously monitor the electrical network.

Figure 4:
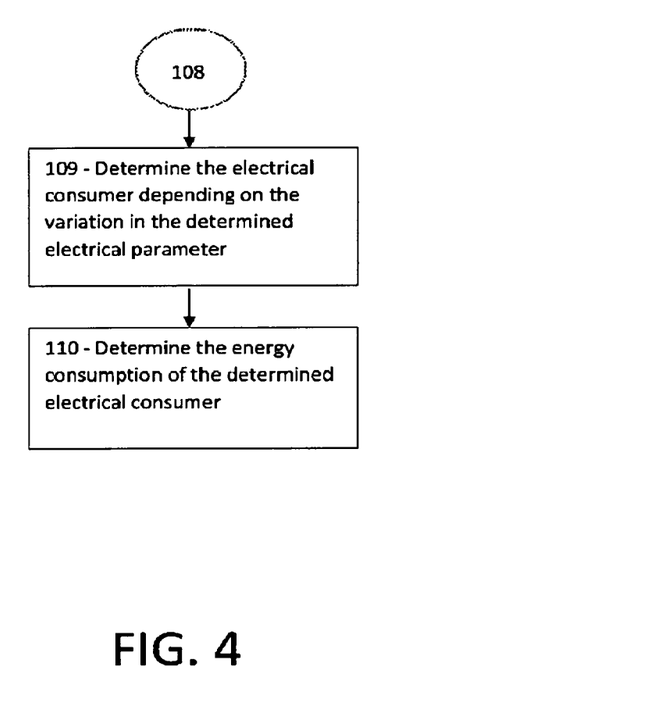
FIG. 4 shows a flowchart exemplarily illustrating an embodiment of a disaggregation method.

In the following an embodiment of a disaggregation method for identifying an electrical consumer, of which an operational state has been changed, in an electrical network will exemplarily be described with reference to a flowchart shown in FIG. 4.

The disaggregation method comprises the steps of the operational state determination method described above with reference to FIG. 3. After step 108, the disaggregation method determines the electrical consumer, i.e. identifies the electrical consumer, of which the operational state has been varied, depending on the variation in the determined electrical parameter, i.e. in this embodiment on the variation in the normalized complex power, in step 109. In step 110, the energy consumption determination unit 15 determines the energy consumption of the determined electrical consumer.

The disaggregation apparatus 1 is preferentially adapted to perform nonintrusive load monitoring (NILM). NILM is a technology that infers the energy consumption of multiple devices, i.e. of multiple electrical consumers, via a single point of measurement. Basically, it is looked at a determined electrical parameter of the electrical network like the overall power consumption or the overall energy consumption, and the contributions of each single electrical consumer can be recognized, for example, for the purposes of providing a breakdown of energy consumption to users. The disaggregation apparatus is preferentially adapted to be sensitive to changes in the operational state of an electrical consumer caused by switching the respective electrical consumer on or off.

A variation in the determined electrical parameter of the electrical network, for example, a variation in an overall energy consumption or in an overall power consumption, can be regarded as an event. The disaggregation apparatus and the operational state determination apparatus, which is comprised by the disaggregation apparatus, are adapted to determine whether an event is generated by changes in devices' status, i.e. in a variation in an operational state of one or several electrical consumers, or by changes due to, for example, voltage fluctuations. In particular, the operational state determination apparatus can be adapted to use the variation of the normalized complex power $\Delta S$ for detecting the respective event. Basically, an event could be detected by determining whether a variation is larger than a given threshold. The operational state determination apparatus and, thus, the disaggregation apparatus consider the decision variable which includes the voltage variations $\Delta V$ and the current variations $\Delta I$, in particular which is similar to the ratio $\Delta V/\Delta I$.

If the ratio $\Delta V/\Delta I$ is larger than zero or another threshold, for example, 50$\Omega$, then it is determined that there has been a variation in the supply voltage. If the ratio $\Delta V/\Delta I$ is smaller than zero, there has been no variation in supply voltage and the observed variation in normalized complex power was due to the change in status of one or more appliances, i.e. electrical consumers. The operational state determination apparatus can therefore also be regarded as reducing the false positives of existing event detection algorithms.

Smart metering and energy monitoring demand is creating a rapidly growing market in the residential sector. Some products on the market today are able to provide appliance-level energy monitoring to provide consumers with a breakdown of their energy usage. However, in order to do so, they must typically measure consumption at the point of usage, which can become very costly if scaled up to include the entire local electricity network, especially if lighting appliances are included. By contrast, NILM requires a single current measurement at the central electricity entrance location, for example, the meter cupboard, and a single voltage measurement to derive how much energy each device consumes.

The main limitation of known event-driven disaggregation approaches is the dependency of the whole system performance on the detection of the event. If one single event is missed, the error tends to propagate in the system.

The present invention allows to increase the reliability of the event detection for energy disaggregation applications.

Although in the above described embodiments the determined electrical parameter is preferentially the consumed power, in particular, the normalized complex power, other variations in other electrical parameters of the electrical network can be considered like the energy consumption or the voltage, wherein, for example, a variation in the consumed energy and/or in the voltage can be used for determining of which electrical consumer the operational state has been changed, in particular, which electrical consumer has been switched on or switched off, if it has been determined that the variation in the consumed energy and/or in the voltage is caused by a variation in the operational state of an electrical consumer depending on a comparison of the decision variable with a predefined threshold.

The disaggregation apparatus and the operational state determination apparatus preferentially look at the variation of the normalized complex power defined in equation (15) mentioned below.

The admittances of the appliances are not really constant and might change due to different voltage levels. If the admittances are not constant, the event detection based on the variation of the normalized complex power suffers from too many false positives since a change in voltage might cause a change in complex admittance so that the normalization proposed in below mentioned equation (14) looses in effectiveness. The problem is further magnified by the fact that the complex admittances of multiple devices change in the same way. This means that if there is a voltage drop all the resistive loads such as incandescent lamps, hair dryers, water boilers, space heaters, et cetera, will have a higher admittance, i.e. lower resistance, thus causing a quite significant change in the normalized power of equation (15) without having any new device. The disaggregation apparatus and the operational state determination apparatus are preferentially adapted to improve the robustness of the event detection based on the normalized power.

In the following the electrical scheme described above with reference to FIG. 1 will mathematically be described.

The delivered voltage $v_0(t)$ is approximated by a sinusoidal wave with a time-varying peak amplitude $\sqrt{2}V_{RMS}(k)$ with $k=-\infty,\ldots,\infty$ that preferentially changes only once per period in the model described above with reference to FIG. 1. The frequency $f_0=\omega/2\pi$ is 50 Hz (in EU, 60 Hz in USA) and assumed constant. The voltage can be then written as $$v_{0,k}(t)=\sqrt{2}V_{RMS}(k)\sin(\omega t+\alpha(k)) \quad (1)$$

The voltage can be equivalently represented in the phasor notation $$v_{0,k}(t)=\sqrt{2}V_{RMS}(k)\sin(\omega t+\alpha(k)) \Leftrightarrow V_0(k)= V_{RMS}(k)e^{j\alpha(k)}$$

where $$V_{RMS}(k) = \sqrt{\frac{1}{T}\int_{t_k}^{t_k+T} v^2(t)dt} \quad (2)$$

and $T=1/f_0$ is the period of the waveform. The current can be also approximated as $$i_{tot,k}(t)=\sqrt{2}I_{RMS,tot}(k)\sin(\omega t+\beta(k)) \quad (3)$$

in which $I_{RMS}(k)$ is defined as $$I_{RMS}(k) = \sqrt{\frac{1}{T}\int_{t_k}^{t_k+T} i^2(t)dt} . \quad (4)$$

Also in this case the phasor notation for the current can be introduced, i.e.

$$I_{tot}(k)=I_{RMS,tot}(k)e^{j\beta(k)}.$$

The voltage $V_1(k)$ seen by each device and can be expressed as $$V_1(k)=V_0(k)-Z_0 I_{tot}(k). \quad (5)$$

It is recalled that for a passive bipole, the complex admittance is defined as $$Y(k) = \frac{I(k)}{V(k)}. \quad (6)$$

In FIG. 1, every electrical appliance, i.e. electrical consumer 3, 4, 5, is modelled from the electrical perspective as a complex admittance $Y_n=1/Z_n$. In this way the overall current can be simply written in the phasor notation as $$I_{tot}(k) = V_1(k)\sum_{n=1}^{N} b_{k,n}Y_n(k), \quad (7)$$

in which the overall current at the time period k is proportional to the sum of all the complex admittances at the period k, wherein $$b_{k,n} \equiv \begin{cases} 1 & \text{if appliance } n \text{ is ON at time } k \\ 0 & \text{if appliance } n \text{ is OFF at time } k \end{cases} \quad (8)$$

to model a switching ON and OFF of the different devices at different time instances. The expression of the complex power can be described as $$S(k)=V_1(k)I_{tot}(k) \quad (9)$$

The amplitude of the complex power is referred to as apparent power $$A(k)=V_{RMS}(k)I_{RMS}(k). \quad (10)$$

The real power is $$P(k)=V_{RMS}(k)I_{RMS}(k)\cos\varphi, \quad (11)$$

the reactive power is $$Q(k)=V_{RMS}(k)I_{RMS,tot}(k)\sin\varphi, \quad (12)$$

and the complex power becomes $$S(k)=P(k)+jQ(k). \quad (13)$$

In FIG. 1, also the location of the current sensor 8 for the NILM is shown, wherein it is assumed to have access to the overall current. From the expression of the current, also the dependency on the voltage can be seen, which should preferentially be reduced, in particular, which should preferentially be eliminated. Therefore, the overall current is divided by the overall voltage and the complex admittance is used, which is expected to be much more stable. The complex admittance of the observed electrical network can be defined by the following equation:

$$\sum_{n=1}^{N} b_{k,n} Y_n(k) = \frac{I_{tot}(k)}{V_1(k)}. \quad (14)$$

However, the admittance is not a measure commonly used. The power, for instance, is much more intuitive and of common use. For this reason, the complex admittance is multiplied by the square of the nominal voltage, and the normalized complex power is defined as $$\tilde{S}(k) = \tilde{P}(k) + j\tilde{Q}(k) = V_{ref}^2 \sum_{n=1}^{N} b_{k,n} Y_n(k), \quad (15)$$

wherein $V_{ref} = 230V$ is assumed, which is the nominal value of the voltage in EU. The normalized power is the most intuitive device signature.

From equation (5) the voltage at time instant k can be written as $$V_1(k) = V_0(k) - Z_0 I_{tot}(k) \quad (16)$$

and the voltage at time instance k+1 as $$V_1(k+1) = V_0(k+1) Z_0 I_{tot}(k+1). \quad (17)$$

If the change in voltage was due to a change in status of a device then the voltage at k+1 can be written as $$V_1(k+1) = V_0 - Z_0 I_{tot}(k) - Z_0 I_n \quad (18)$$

where $I_n$ is the current flowing through device n. Taking the difference between (18) and (16), $$\Delta V = V_1(k+1) V_1(k) = -Z_0 I_n \quad (19)$$

can be obtained.

If the change in voltage was due to voltage fluctuation, then the voltage at k+1 can be written as $$V_1(k+1) = V_0(k) - Z_0 I_{tot}(k+1) \quad (20)$$

where $I_n$ is the current flowing through device n. Taking the difference between (20) and (16), $$\Delta V = V_1(k+1) - V_1(k) = -Z_0(I_{tot}(k+1) - I_{tot}(k)) = -Z_0 \Delta I \quad (21)$$

can be obtained.

It should be noted that $\Delta I$ is small. Also, $\Delta V$ is usually not large, typically less than 5 to 10% of the nominal voltage, as per power quality norms defined by regulation.

From equation (21) the value of the effective internal impedance can be estimated as $$Z_0 = -\frac{\Delta V}{\Delta I}. \quad (22)$$

It is proposed to use equation (22) to discriminate between events caused by the changing state of one or several devices and events caused by voltage fluctuations. The effective internal impedance $Z_0$ is small and the energy distribution network preferentially aims at having $Z_0$ as small as possible. A large $Z_0$ corresponds to large losses in the network and losses in revenues.

If event detection has been generated by a voltage fluctuation, then $Z_0$ of equation (22) as obtained from equation (21) has a large absolute value of, for example, thousands of Ohm and is negative. If the event is generated by a device, i.e. an electrical consumer, then it is positive and in the order of the unit of Ohm. Thus, it is preferentially determined that a change in the complex power is caused by an event generated by an electrical consumer, if the ratio $\Delta V/\Delta I$ is negative and $Z_0$ is positive. This corresponds to a determination that an event is generated by an electrical consumer, if the condition $Re(\Delta V/\Delta I) < 0$ is fulfilled.

Figure 5:
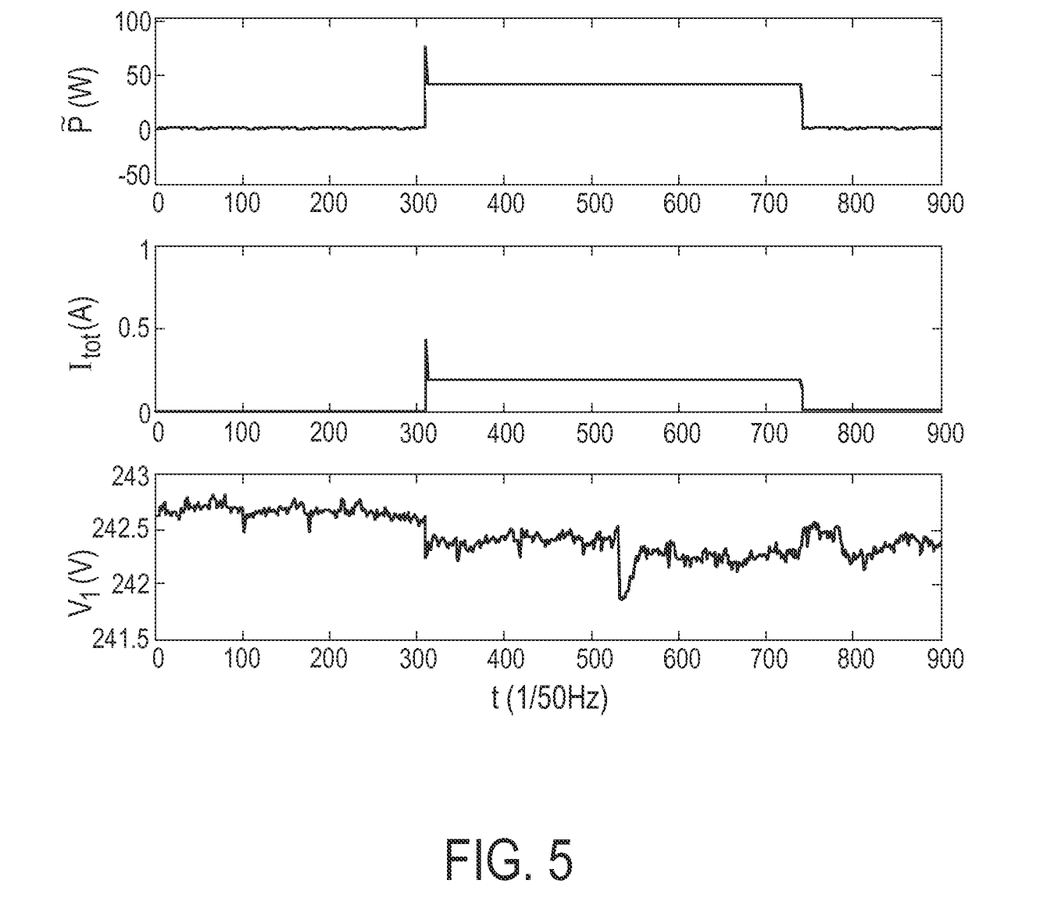
FIGS. 5 and 6 show exemplarily a voltage, a current and a normalized overall power over time, while an electrical consumer is switched on and switched off.
Figure 6:
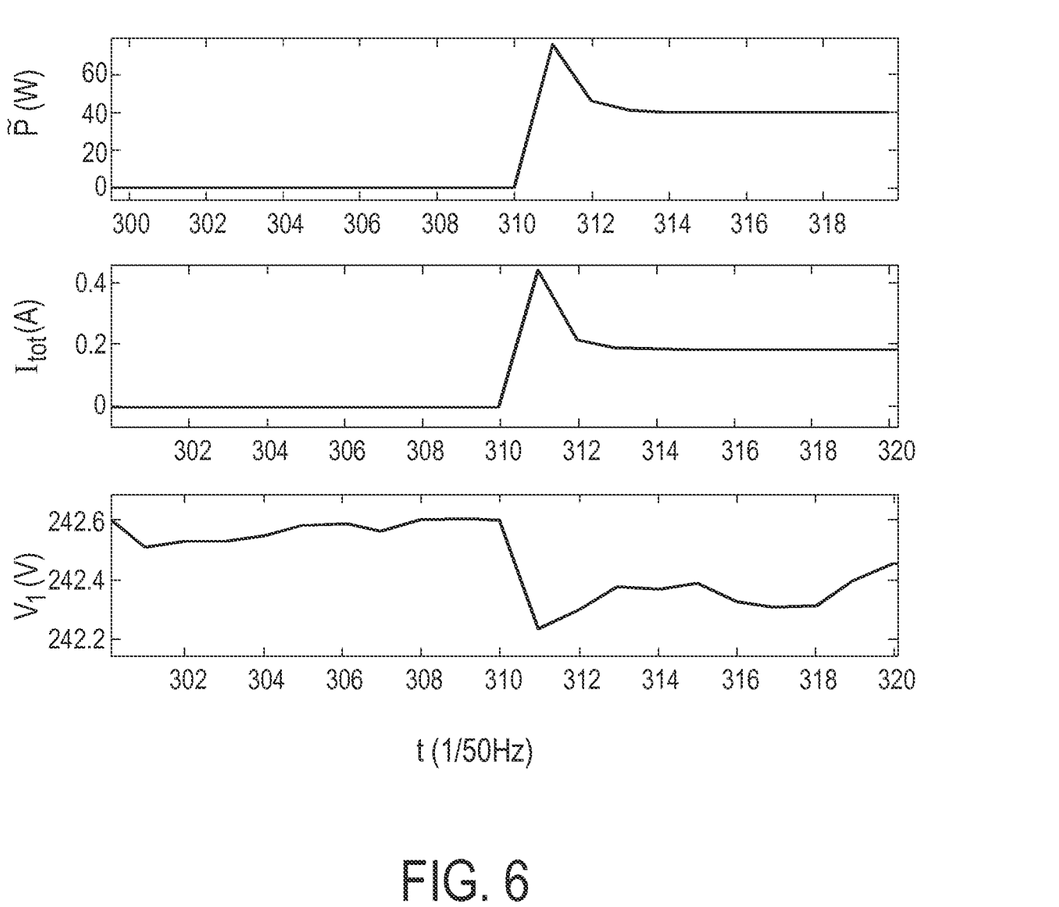

FIG. 5 shows exemplarily a voltage V measured by the voltage meter 7, a current I measured by the current meter 8 and the normalized power P determined by the electrical parameter determination unit 11 depending on the time t. In this example, the electrical consumer is an incandescent lamp which has been switched on at around t=300 and switched off at around t=750. FIG. 6 shows exemplarily details from FIG. 5 around t=310. In particular, in FIG. 5 an event is shown at t=311. The relatively small voltage drop generated by the event can also be seen in FIG. 6.

The normalized power is calculated in accordance with equation (15). The current and voltage plots indicate what is preferentially anticipated to be a large current variation and a small voltage variation. From FIG. 6 a variation in current of about 0.18 A and a variation in voltage of about −0.4 V can be derived. The effective internal impedance can be estimated by using equation (22):

$$Z_0 = \frac{0.4V}{0.18A} \cong 2.2\Omega. \quad (23)$$

The effective internal impedance is positive and small and therefore the variation in normalized power is generated by the change of status of an appliance, i.e. by the variation of an operational state of an electrical consumer.

Figure 7:
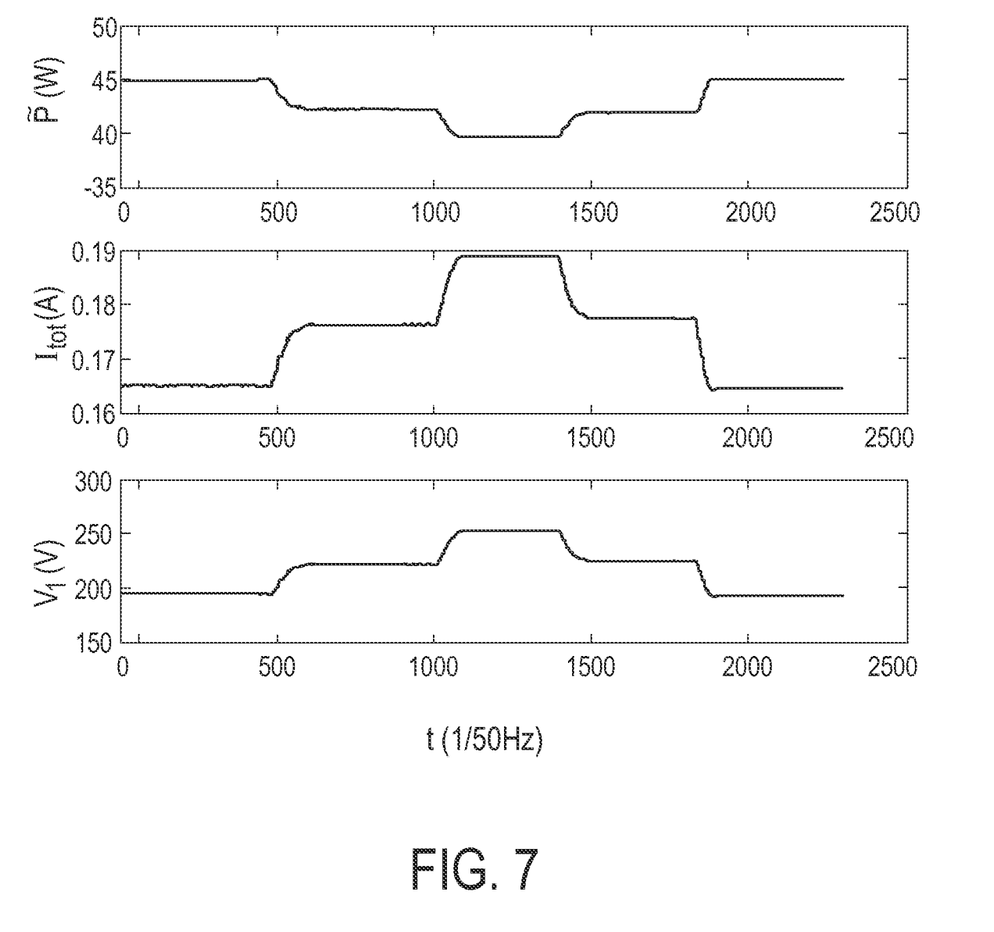
FIGS. 7 and 8 show exemplarily a voltage, a current and an overall normalized power, while the voltage fluctuates in the electrical network.
Figure 8:
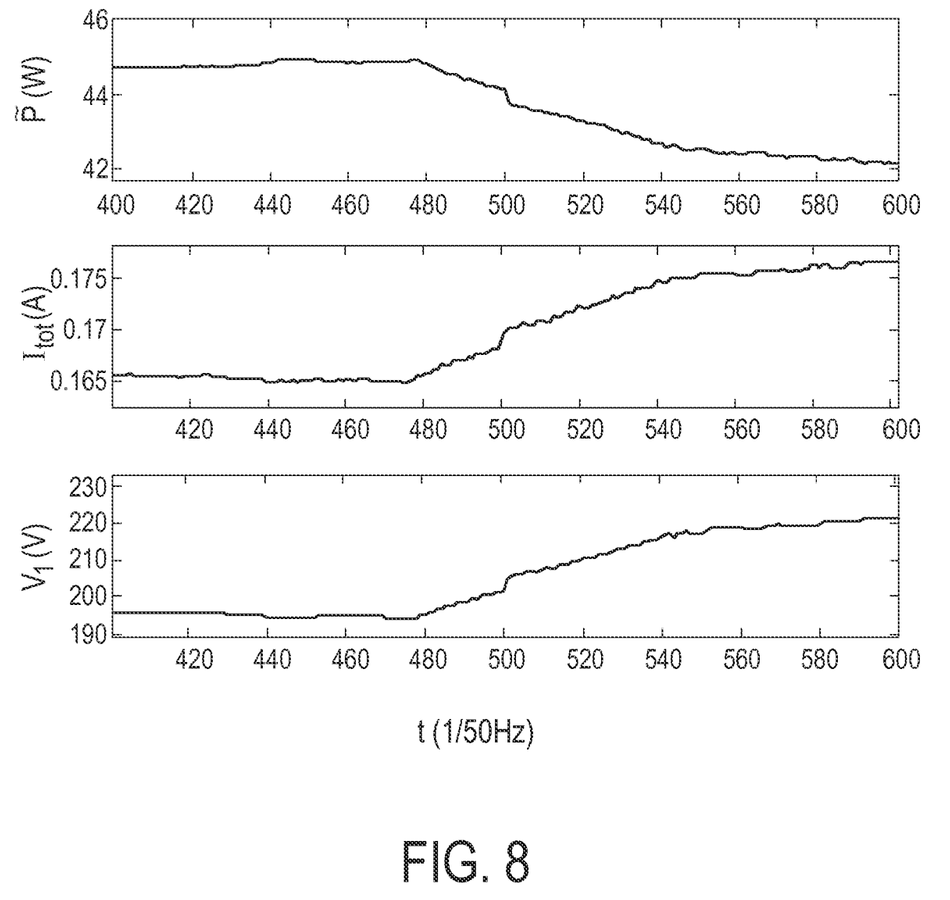

FIG. 7 shows exemplarily the measured overall current, the measured voltage and the measured overall normalized power of the electrical network comprising the incandescent lamp as an electrical consumer, wherein in FIG. 7 not the incandescent lamp is switched on and switched off, but the voltage fluctuates between 200 V and 250 V. FIG. 8 shows exemplarily details from FIG. 7 in a temporal range of 400 to 600.

Since, as can be seen in FIGS. 7 and 8, the normalized power varies, a conventional event detection algorithm applied to the normalized power would indicate an event caused by a change in an operational state of an electrical consumer. Particularly from FIG. 8 it can be inferred that the change in current is a bit more than 0.01 A. By using equation (22) the effective internal impedance can be estimated as being $$Z_0 = -\frac{23V}{0.01A} \cong -2300\Omega \quad (24)$$

which significantly differs from the effective internal impedance estimated from the example described above with reference to FIGS. 5 and 6. In the example described with reference to FIGS. 7 and 8 the decision variable, i.e. the ratio of the measured voltage and the measured current defining the effective internal impedance, is larger than a predefined threshold, which is, in this example, zero. The variation classification unit 10 would therefore determine that, in this example, the change in the determined electrical parameter, i.e. in the normalized power which has been determined in accordance with equation (15), is not caused by a variation in an operational state of an electrical consumer, but by, for example, voltage fluctuations in the electrical network.

Although in the embodiment described above with reference to FIG. 1 the electrical network comprises three electrical consumers, the electrical network can comprise more or less than three consumers. Moreover, the disaggregation apparatus can be adapted to determine of which electrical consumers the operational state has been changed, in particular, which electrical consumers have been switched on or switched off, even if several electrical consumers are active, i.e. are switched on.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or device may fulfill the functions of several items recited in the claims. The mere fact that certain measures are recited in mutually different dependent claims does not indicate that a combination of these measures cannot be used to advantage.

Determinations like the determination of a decision variable, the determination of an electrical parameter, the determination whether a determined electrical parameter is caused by a variation in an operational state of an electrical consumer, et cetera performed by one or several units or devices can be performed by any other number of units or devices. For example, steps 102 to 110 can be performed by a single unit of by any other number of different units. The determinations and/or the control of the disaggregation apparatus in accordance with the disaggregation method and/or the control of the operational state determination apparatus in accordance with the operational state determination method can be implemented as program code means of a computer program and/or as dedicated hardware.

A computer program may be stored/distributed on a suitable medium, such as an optical storage medium or a solid-state medium, supplied together with or as part of other hardware, but may also be distributed in other forms, such as via the Internet or other wired or wireless telecommunication systems.

Any reference signs in the claims should not be construed as limiting the scope.

The invention relates to an operational state determination apparatus for determining whether a variation in a determined electrical parameter of an electrical network is caused by a variation in an operational state of an electrical consumer of the electrical network. The electrical network comprises multiple electrical consumers and a voltage source, wherein a variation classification unit determines whether a variation in the determined electrical parameter of the electrical network is caused by a variation in the operational state of an electrical consumer of the network depending on a decision variable which depends on a variation in a measured voltage and a variation in a measured current of the electrical network. This determination can be performed, without directly using the variation in the determined electrical parameter of the electrical network and is therefore less influenced by random voltage fluctuations in the electrical network.

The invention claimed is:

1. A non-intrusive operational state determination apparatus for determining whether a variation in a determined electrical parameter of an electrical network is caused by a variation in an operational state of an electrical consumer of the electrical network, wherein the electrical network comprises multiple electrical consumers and a voltage source, wherein the operational state determination apparatus comprises:
   a voltage meter for measuring a voltage in the electrical network at only a single electricity exit location in the electrical network,
   a current meter for measuring a current in the electrical network at only a single electricity entrance location in the electrical network,
   a processor to determine a decision variable based on a variation in the measured voltage and a variation in the measured current, wherein the decision variable is indicative of whether a variation in the determined electrical parameter of the electrical network is caused by a variation in the operational state of an electrical consumer, and wherein the processor further determines whether a variation in the determined electrical parameter of the electrical network is caused by a variation in the operational state of an electrical consumer of the network depending on the determined decision variable;
   wherein if a ratio of the variation of the voltage and a variation of the current is smaller than a threshold it is determined that the electrical parameter is caused by a variation in the operational state of an electrical consumer, if the ratio is larger than the threshold it is determined that the electrical parameter is not caused by a variation in the operational state of an electrical consumer.

2. The non-intrusive operational state determination apparatus as defined in claim 1, wherein the processor determines if a variation in the determined electrical parameter of the electrical network is caused by a variation in the operational state of an electrical consumer of the network depending on the determined decision variable and depending on the magnitude of the variation in the determined electrical parameter.

3. The non-intrusive operational state determination apparatus as defined in claim 1, wherein the operational state determination apparatus further comprises an electrical parameter determination unit for determining the electrical parameter depending on at least one of the measured voltage and the measured current.

4. The non-intrusive operational state determination apparatus as defined in claim 3, wherein the processor determines power consumed by the electrical network as the electrical parameter.

5. The non-intrusive operational state determination apparatus as defined in claim 1, wherein the processor further determines whether a variation in the determined electrical parameter is present.

6. A disaggregation apparatus for identifying an electrical consumer, of which an operational state has been changed, in an electrical network, wherein the electrical network comprises multiple electrical consumers and a voltage source, the disaggregation apparatus comprising:
   a non-intrusive operational state determination apparatus for determining whether a variation in a determined electrical parameter of an electrical network is caused by a variation in an operational state of an electrical consumer of the electrical network as defined in claim

1, wherein the processor determines the electrical parameter depending on at least one of the measured voltage and the measured current, and to determine an electrical consumer, of which the operational state has been varied, depending on the variation in the determined electrical parameter, if the processor has determined that the variation in the determined electrical parameter is caused by a variation in the operational state of an electrical consumer of the network.

7. The disaggregation apparatus as defined in claim 6, wherein the processor further determines the energy consumption of the determined electrical consumer.

8. A disaggregation computer program for identifying an electrical consumer, of which an operational state has been changed, in an electrical network, wherein the electrical network comprises multiple electrical consumers and a voltage source, the disaggregation computer program comprising program code means for causing a disaggregation apparatus as defined in claim 6, when the disaggregation computer program is run on a computer controlling the disaggregation apparatus.

9. An operational state determination computer program for determining whether a variation in a determined electrical parameter of an electrical network is caused by a variation in an operational state of an electrical consumer of the electrical network, the operational state determination computer program comprising program code means for causing an operational state determination apparatus as defined in claim 1, when the operational state determination computer program is run on a computer controlling the operational state determination apparatus.

10. The non-intrusive operational state determination apparatus as defined in claim 1, wherein if the electrical parameter is caused by a variation in the operational state of an electrical consumer, the processor further determines an electrical consumer of which the operational state has been varied, depending on the variation in the determined electrical parameter.

11. A non-intrusive operational state determination method for determining whether a variation in a determined electrical parameter of an electrical network is caused by a variation in an operational state of an electrical consumer of the electrical network, wherein the electrical network comprises multiple electrical consumers and a voltage source, wherein the operational state determination method comprises:

measuring a voltage in the electrical network at only a single electricity exit location in the electrical network, measuring a current in the electrical network at only a single electricity entrance location in the electrical network, determining a decision variable depending on a variation in the measured voltage and a variation in the measured current, wherein the decision variable is determined depending on a ratio of a variation in the voltage and a variation in the current and indicative of whether a variation in the determined electrical parameter of the electrical network is caused by a variation in the operational state of an electrical consumer without measuring the voltage and current of each of the multiple electrical consumers or if the variation is voltage fluctuation in the electrical network, determining whether a variation in the determined electrical parameter of the electrical network is caused by a variation in the operational state of an electrical consumer of the network depending on the determined decision variable;

wherein if a ratio of the variation of the voltage and a variation of the current is smaller than a threshold it is determined that the electrical parameter is caused by a variation in the operational state of an electrical consumer, if the ratio is larger than the threshold it is determined that the electrical parameter is not caused by a variation in the operational state of an electrical consumer.

12. A disaggregation method for identifying an electrical consumer, of which an operational state has been changed, in an electrical network, wherein the electrical network comprises multiple electrical consumers and a voltage source, the disaggregation method comprising:

a method for determining whether a variation in a determined electrical parameter of an electrical network is caused by a variation in an operational state of an electrical consumer of the electrical network as defined in claim 11, determining the electrical parameter depending on at least one of the measured voltage and the measured current, determining an electrical consumer, of which the operational state has been varied, depending on the variation in the determined electrical parameter, if the variation in the determined electrical parameter is caused by a variation in the operational state of an electrical consumer of the network.

\* \* \* \* \*